United States Patent
Liu et al.

(10) Patent No.: US 9,786,617 B2
(45) Date of Patent: Oct. 10, 2017

(54) CHIP PACKAGES AND METHODS OF MANUFACTURE THEREOF

(71) Applicant: Taiwan Semiconductor Manufacturing Company, Ltd., Hsin-Chu (TW)

(72) Inventors: Zi-Jheng Liu, Hsin-Chu (TW); Chen-Cheng Kuo, Hsin-Chu (TW); Chung-Shi Liu, Hsin-Chu (TW); Hung-Jui Kuo, Hsin-Chu (TW); Yu-Hsiang Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,267

(22) Filed: Nov. 16, 2015

(65) Prior Publication Data
US 2017/0141055 A1 May 18, 2017

(51) Int. Cl.
*H01L 23/00* (2006.01)
*H01L 21/683* (2006.01)
*H01L 21/56* (2006.01)
*H01L 23/31* (2006.01)

(52) U.S. Cl.
CPC .......... *H01L 24/05* (2013.01); *H01L 21/565* (2013.01); *H01L 21/568* (2013.01); *H01L 21/6835* (2013.01); *H01L 23/3107* (2013.01); *H01L 24/03* (2013.01); *H01L 24/11* (2013.01); *H01L 24/13* (2013.01); *H01L 2221/68359* (2013.01); *H01L 2224/0231* (2013.01); *H01L 2224/02371* (2013.01); *H01L 2224/02372* (2013.01); *H01L 2224/0361* (2013.01); *H01L 2224/0362* (2013.01); *H01L 2224/0382* (2013.01); *H01L 2224/03462* (2013.01); *H01L 2224/0401* (2013.01); *H01L 2224/05012* (2013.01); *H01L 2224/05024* (2013.01); *H01L 2224/12105* (2013.01)

(58) Field of Classification Search
CPC ...................................................... H01L 24/05
See application file for complete search history.

(56) References Cited

U.S. PATENT DOCUMENTS

| | | |
|---|---|---|
| 7,838,424 B2 | 11/2010 | Karta et al. |
| 7,863,742 B2 | 1/2011 | Yu et al. |
| 7,932,601 B2 | 4/2011 | Chang et al. |
| 8,754,508 B2 | 6/2014 | Chen et al. |
| 8,772,151 B2 | 7/2014 | Chen |
| 8,846,548 B2 | 9/2014 | Tu et al. |

(Continued)

*Primary Examiner* — William Harriston
(74) *Attorney, Agent, or Firm* — Slater Matsil, LLP

(57) ABSTRACT

A chip package may include a die and a redistribution structure over the die. The redistribution structure may include a die, a redistribution structure over the die, and an under-bump metallurgy (UBM) structure over the redistribution structure. The UBM structure may include a central portion, a peripheral portion physically separated from and surrounding a perimeter of the central portion, and a bridging portion having a first end and a second end opposite the first end. The first end of the bridging portion may be coupled to the central portion of the UBM structure, while the second end of the bridging portion may be coupled to the peripheral portion of the UBM structure.

20 Claims, 13 Drawing Sheets

(56) References Cited

U.S. PATENT DOCUMENTS

| | | | |
|---|---|---|---|
| 2009/0236703 A1* | 9/2009 | Shen | H01L 21/565 |
| | | | 257/666 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0252610 A1* | 9/2014 | Chen | H01L 23/562 |
| | | | 257/738 |
| 2014/0252647 A1* | 9/2014 | Huang | H01L 23/49827 |
| | | | 257/774 |
| 2014/0262468 A1 | 9/2014 | Chen et al. | |
| 2014/0264885 A1 | 9/2014 | Tsai et al. | |
| 2015/0001713 A1* | 1/2015 | Goetz | H01L 24/19 |
| | | | 257/738 |

* cited by examiner

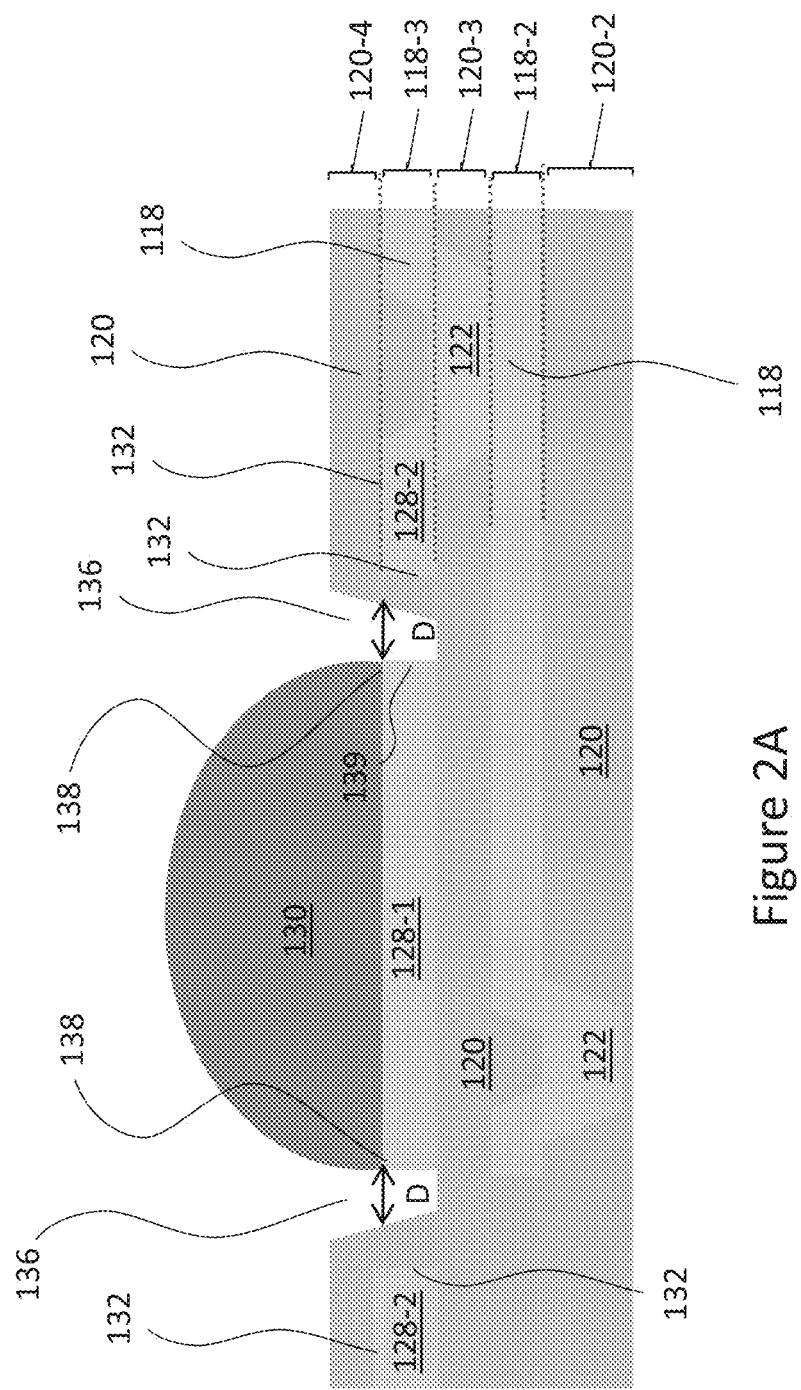

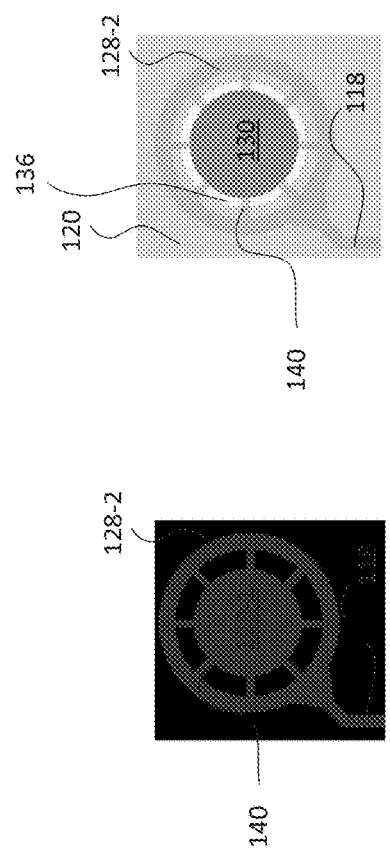
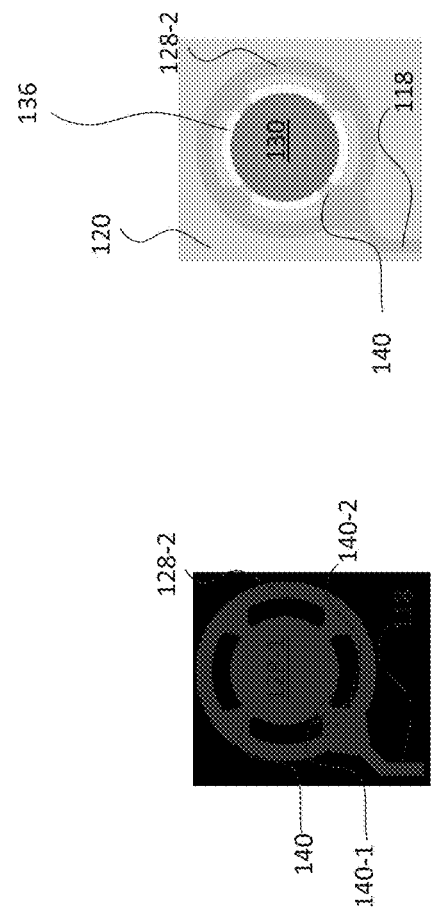
Figure 4A  Figure 4B  Figure 4C  Figure 4D

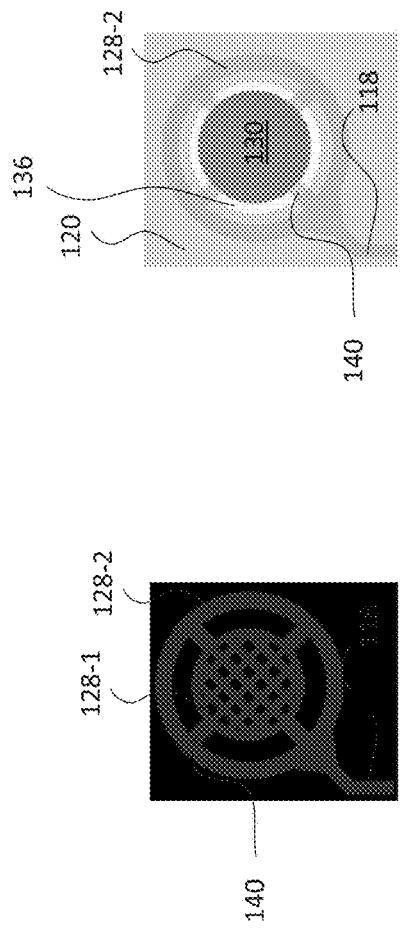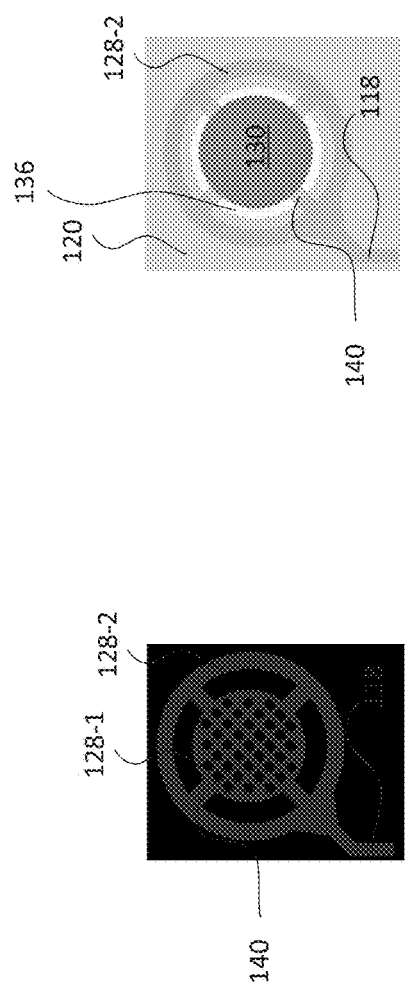

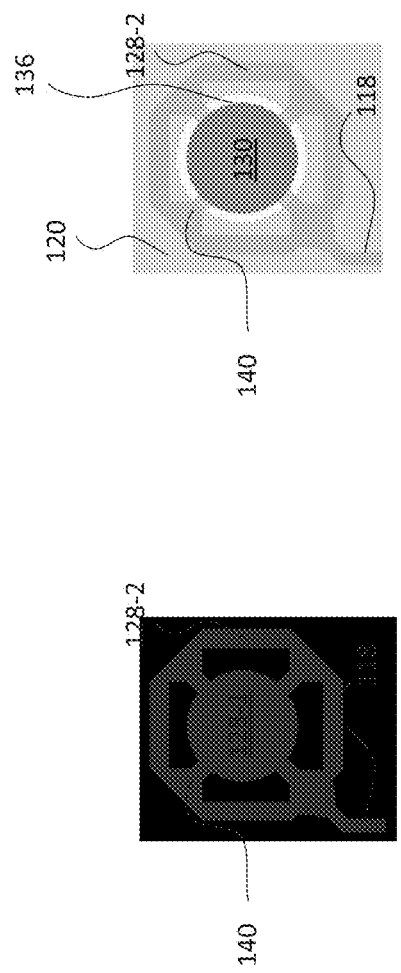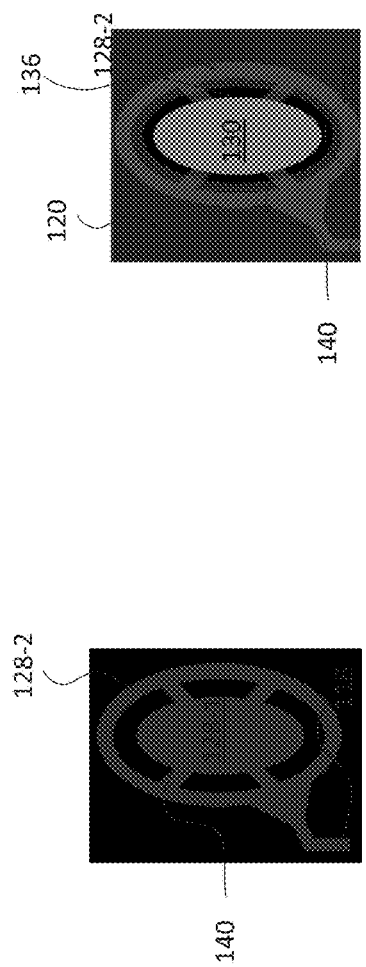

CHIP PACKAGES AND METHODS OF MANUFACTURE THEREOF

BACKGROUND

In an aspect of packaging technologies, redistribution layers (RDLs) may be formed over a chip and electrically connected to active devices in the chip. Input/output (I/O) connectors such as solder balls on under-bump metallurgy (UBMs) may then be formed to electrically connect to the chip through the RDLs. An advantageous feature of this packaging technology is the possibility of forming fan-out packages. Thus, the I/O pads on the chip can be redistributed to cover a greater area than the chip, and hence the number of I/O pads packed on the surfaces of the packaged chips can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2C show an enlarged view of an under-bump metallurgy (UBM) structure of the chip package shown in FIG. 1, in accordance with an embodiment.

FIGS. 4A to 4L show various examples of a UBM structure, in accordance with various embodiments.

DETAILED DESCRIPTION

Figure 1:
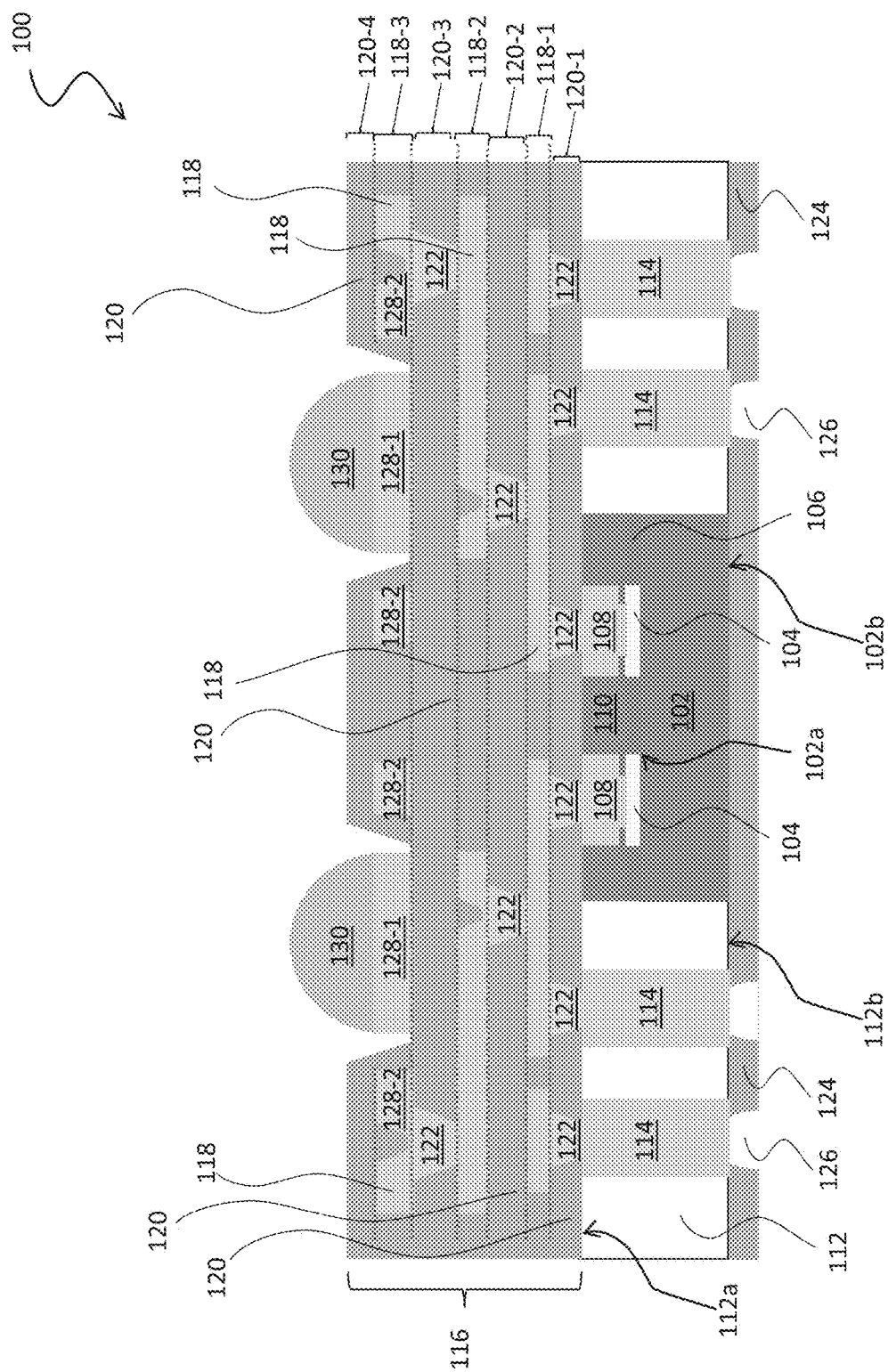
FIG. 1 shows a cross-sectional view of a chip package, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of a chip package 100, in accordance with an embodiment. The chip package 100 includes a die 102, which may have a first surface 102a and a second surface 102b opposite the first surface 102a. In some embodiments, the first surface 102a of the die 102 may be an active surface of the die 102. The die 102 may include a semiconductor substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. As an example, in the embodiment shown in FIG. 1, the first surface 102a of the die 102 may be the top-most surface of the ILD and IMD layers. The ILD and IMD layers may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the first surface 102a of the die 102. For example, contact pads 104 may be formed over the first surface 102a of the die 102 (e.g. over the interconnect structure of the die 102 and may be electrically connected to the active devices through the various conductive features in the interconnect structure). The contact pads 104 may comprise a conductive material such as aluminum, copper, and the like. Furthermore, a passivation layer 106 may be formed over the interconnect structure and the contact pads. In some embodiments, passivation layer 106 may be formed of non-organic materials such as silicon oxide, un-doped silicate glass, silicon oxynitride, and the like. Other suitable passivation materials may also be used. Portions of passivation layer 106 may cover edge portions of the contact pads 104.

Additional interconnect features, such as additional passivation layers, conductive pillars, and/or under bump metallurgy (UBM) layers, may also be optionally formed over contact pad 104. For example, as illustrated by FIG. 1, conductive pillars 108 may be formed over and electrically connected to contact pads 104. The conductive pillars 108 may comprise a suitable conductive material such as copper, aluminum, tungsten, combinations thereof, and the like. A dielectric layer 110 may be formed around such conductive pillars 108. The various features of die 102 may be formed by any suitable method and are not described in further detail herein. Furthermore, the general features and configuration of the die 102 described above are but one example embodiment, and the die 102 may include any combination of any number of the above features as well as other features.

The chip package 100 may include a molding compound 112 that may at least laterally encapsulate the die 102. The molding compound 112 may have a first surface 112a and a second surface 112b opposite the first surface 112a. In some embodiments, such as the example shown in FIG. 1, the second surface 112b of the molding compound 112 may be substantially co-planar with the second surface 102b of the die 102. The molding compound 112 may include any suitable material such as an epoxy resin, phenol resin, a thermally-set resin, and the like. In addition to these materials, molding compound 112 may or may not include various additive fillers, such as silicon oxide, aluminum oxide, boron nitride, and the like.

The chip package 100 may include one or more first conductive vias 114 laterally separated from the die 102. Only four first conductive vias 114 are shown in FIG. 1 as an example. However, in another example, the number of first conductive vias 114 may be less than four (e.g. two, three) or may be more than four (e.g. five, six, or even more). The one or more first conductive vias 114 may be at least laterally encapsulated by the molding compound 112. The one or more first conductive vias 114 may comprise similar materials as the conductive pillars 108.

The chip package 100 may additionally include a redistribution structure 116 over the first surface 112a of the molding compound 112. The redistribution structure 116 may extend laterally past edges of die 102 over the one or more first conductive vias 114 and over the first surface 112a of molding compound 112. The redistribution structure 116 may include one or more redistribution layers (RDLs) 118 formed in one or more polymer layers 120. The one or more RDLs 118 may comprise similar materials as the conductive pillars 108. Polymer layers 120 may comprise any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like). The RDLs 118 of the redistribution structure 116 may be electrically connected to the conductive pillars 108. Accordingly, electrical connections from the die 102 may be redistributed (e.g. fanned-out) by the RDLs 118 of the redistribution structure 116. Similarly, the RDLs 118 of the redistribution structure 116 may be electrically connected to the one or more first conductive vias 114.

As shown in the example of FIG. 1, the redistribution structure 116 may be a multi-level redistribution structure. In other words, the RDLs 118 and the polymer layers 120 may be spatially distributed over two or more levels. As an example, in the embodiment of FIG. 1, the RDLs 118 are spatially arranged in a first redistribution level 118-1, a second redistribution level 118-2, and a third redistribution level 118-3. Similarly, in the embodiment of FIG. 1, the polymer layers 120 are spatially arranged in a first polymer level 120-1, a second polymer level 120-2, a third polymer level 120-3, and a fourth polymer layer 120-4.

The first polymer level 120-1 may be disposed between the first redistribution level 118-1 and the molding compound 112. The second polymer level 120-2 may be disposed between the first redistribution level 118-1 and the second redistribution level 118-2. The third polymer level 120-3 may be disposed between the second redistribution level 118-2 and the third redistribution level 118-3. The fourth polymer level 120-4 may be disposed over the third redistribution level 118-3. As shown in FIG. 1, the RDLs 118 in different redistribution levels 118-1, 118-2, 118-3 may be electrically connected to each other by second conductive vias 122 that may be formed in the second and third polymer levels 120-2, 120-3. Furthermore, the conductive pillars 108 and the one or more first conductive vias 114 may be electrically connected to the redistribution structure 116 through second conductive vias 122 that may be formed in the first polymer layer 120-1. The second conductive vias 122 may comprise similar materials as the conductive pillars 108.

The chip package 100 may include an insulating layer 124 disposed at the second surfaces 102b, 112b of the die 102 and the molding compound 112. The insulating layer 124 may comprise a dielectric material such as polyimide (PI), polybenzoxazole (PBO), benzocyclobuten (BCB), epoxy, silicone, acrylates, nano-filled pheno resin, siloxane, a fluorinated polymer, polynorbornene, or the like. In some embodiments, such as the example shown in FIG. 1, the insulating layer 124 may have openings 126 formed therein. The openings 126 may expose a surface of the one or more first conductive vias 114, thereby allowing interconnection of the chip package 100 to another device, package, or the like.

The chip package 100 may further includes a UBM structure 128-1, 128-2, which may comprise similar materials as the conductive pillars 108. The UBM structure 128-1, 128-2 may be formed in the redistribution level of the redistribution structure 116 that is farthest from the die 102. For example, in the embodiment shown in FIG. 1, the third redistribution level 118-3 is the redistribution level farthest from the die 102, and thus, the UBM structure 128-1, 128-2 is formed in the third redistribution level 118-3 of the redistribution structure 116. The UBM structure 128-1, 128-2 may include a central portion 128-1 and a peripheral portion 128-2 that is physically separated (e.g. laterally separated) from the central portion 128-1. In some embodiments, the central portion 128-1 may be a pad region over which an external connector 130 is formed. The external connector 130 may include a BGA ball, a C4 bump, a solder bump, or the like.

Figure 2B:
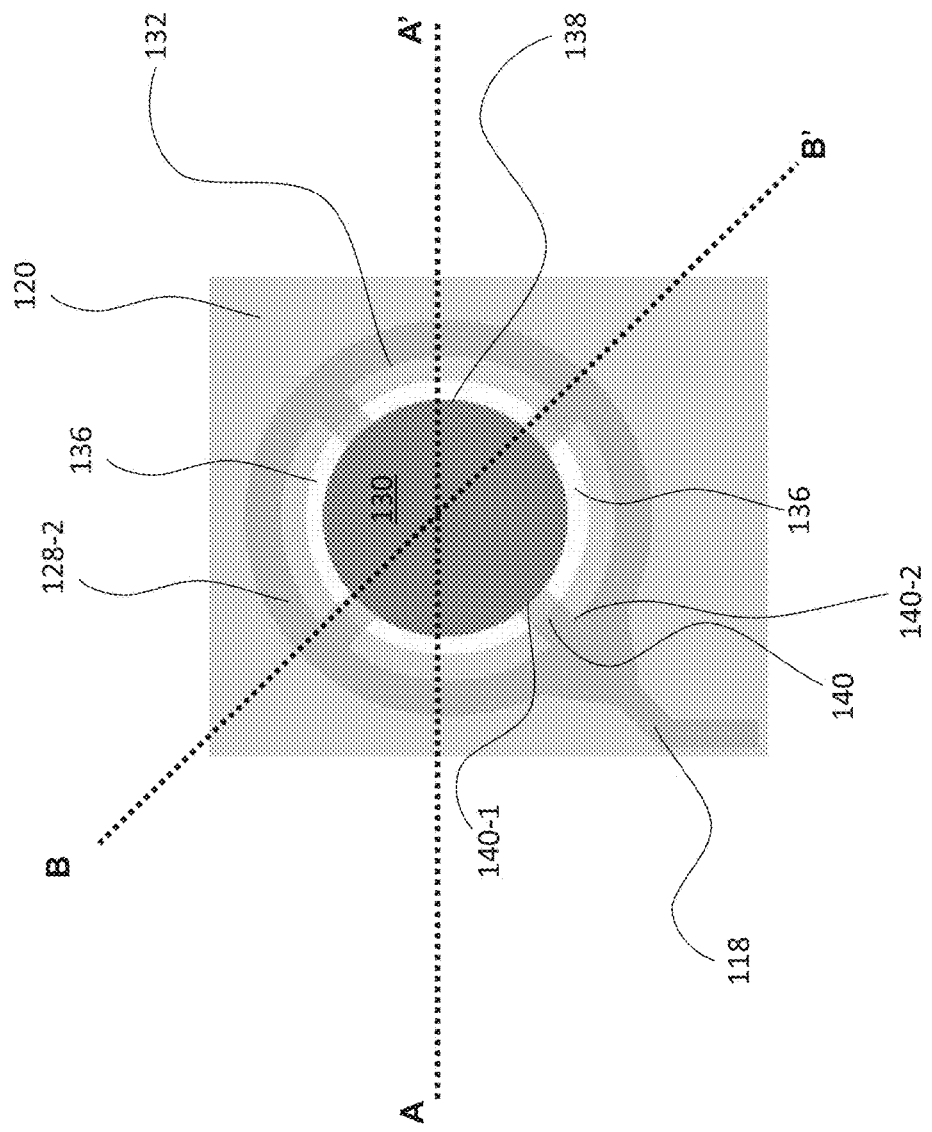
Figure 2C:
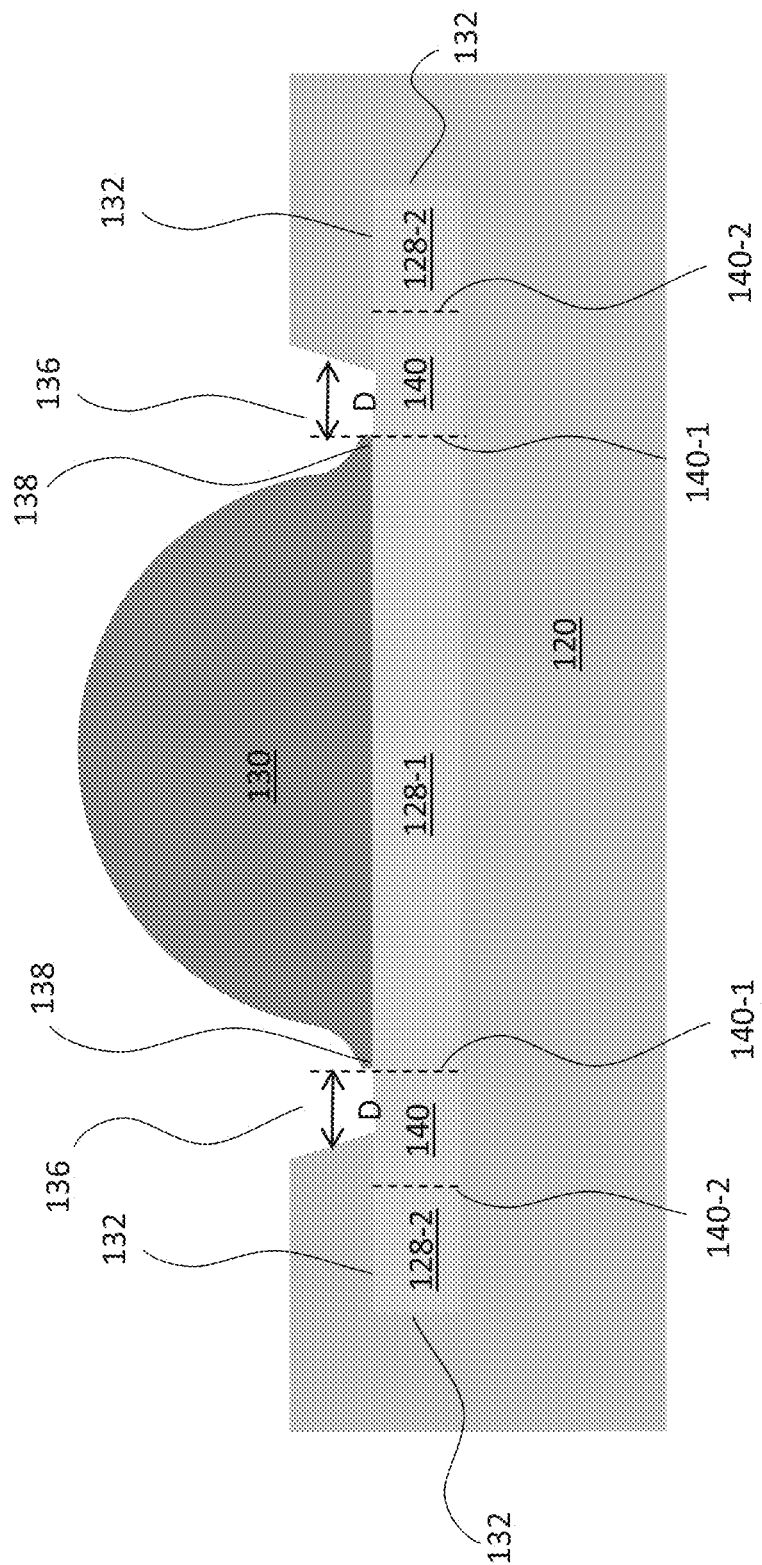

FIG. 2A shows an enlarged cross-sectional view of the UBM structure 128-1, 128-2, the external connector 130, and the polymer layer 120 of the chip package 100, in accordance with an embodiment. FIG. 2B shows a top-down view of the UBM structure 128-1, 128-2, the external connector 130, and the polymer layer 120 shown in FIG. 2A, in accordance with an embodiment. The cross-sectional view shown in FIG. 2A may, as an example, be a view taken along the line A-A' in FIG. 2B. FIG. 2C shows another cross-sectional view of the UBM structure 128-1, 128-2, the external connector 130, and the polymer layer 120 of the chip package 100, in accordance with an embodiment. The cross-sectional view shown in FIG. 2C may, as an example, be a view taken along the line B-B' in FIG. 2B.

As shown in FIGS. 2A to 2C, the peripheral portion 128-2 of the UBM structure 128-1, 128-2 may be covered (e.g. enclosed) by the polymer layer 120. In other words, the peripheral portion 128-2 of the UBM structure 128-1, 128-2 may be encapsulated by the polymer layer 120. As a result, a first interface 132 between the polymer layer 120 and the peripheral portion 128-2 of the UBM structure 128-1, 128-2 is formed. There may be a gap 136 (e.g. air gap) that separates (e.g. laterally separates) the central portion 128-1 of the UBM structure 128-1, 128-2 from the portion of the polymer layer 120 that covers the peripheral portion 128-2. In some embodiments, a sidewall of the portion of the polymer layer 120 that covers the peripheral portion 128-2 may be separated from a sidewall 139 of the central portion 128-1 of the UBM structure 128-1, 128-2 by a distance D, which may be in a range from about 2 micrometers to about 50 micrometers.

As shown in FIG. 2B, the peripheral portion 128-2 of the UBM structure 128-1, 128-2 may be physically separated from the central portion 128-1 and may surround a perimeter of the central portion 128-1. In some embodiments, such as the example shown in FIG. 2B, the peripheral portion 128-2 is an outer ring structure that surrounds the central portion 128-1. As shown in FIGS. 2B and 2C, the peripheral portion 128-2 and the central portion 128-1 may be connected (e.g. electrically and/or physically connected) by one or more bridging portions 140 (which may be referred to as bridges) that may be disposed between the central portion 128-1 and the peripheral portion 128-2. The bridge 140 may have a first end 140-1 coupled (e.g. physically coupled) to the central portion 128-1 of the UBM structure 128-1, 128-2. The bridge 140 may have a second end 140-2 (opposite the first end 140-1) coupled (e.g. physically coupled) to the peripheral portion 128-2 of the UBM structure 128-1, 128-2.

As shown in FIG. 2B, the peripheral portion 128-2 of the UBM structure 128-1, 128-2 may be coupled (e.g. electrically and/or physically coupled) to the RDLs 118 (e.g. the RDLs 118 in the third redistribution level 118-3). Consequently, the one or more bridges 140 may function to connect the external connector 130 to the redistribution structure 116. In the example shown in FIG. 2B, four bridges 140 are provided at regular intervals along a perimeter of the central portion 128-1 of the UBM structure 128-1, 128-2. However, in another embodiment, a different number of bridges 140 may be formed. For example, in the embodiment shown in FIGS. 4A and 4B, eight bridges 140 are formed at regular intervals along a perimeter of the central portion 128-1 of the UBM structure 128-1, 128-2.

Several advantages are realized using the UBM structure 128-1, 128-2 shown in FIGS. 2A to 2C. First, the gap 136 is created between the polymer layer 120 and a second interface 138, which is an interface between the external connector 130 and the central portion 128-1 of the UBM structure 128-1, 128-2. The provision of this gap 136 can prevent physical contact between polymer layer 138 and the second interface 138. This, in turn, can eliminate or substantially reduce the formation of cracks, intermetallic compounds (IMC), and flux attack effects that can occur during formation, e.g. ball mount, of the external connector 130.

Figure 3A:
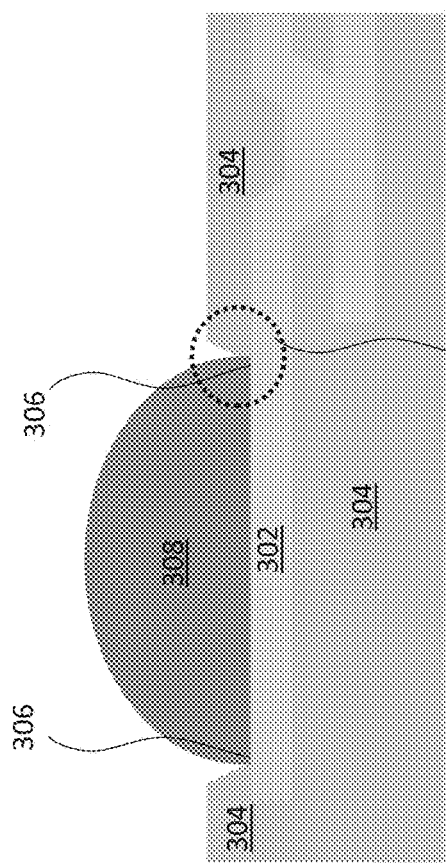
FIGS. 3A and 3B show a typical UBM structure.
Figure 3B:
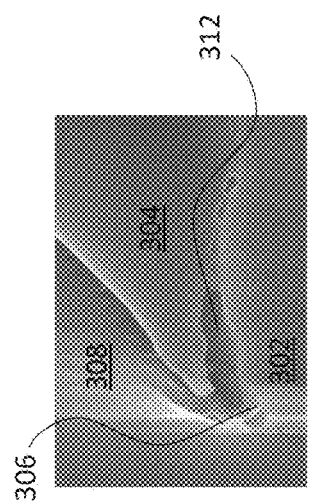

As an example, FIG. 3A shows a typical UBM structure 302 where a polymer layer 304 is in physical contact with or in close physical proximity to an interface 306 between the typical UBM structure 302 and an external connector 308. FIG. 3B shows a scanning electron microscope (SEM) image of the region 310 shown in FIG. 3A. As shown in FIG. 3B, a crack 312 may be formed between the polymer layer 304 and the UBM structure 302. This can be a result of IMC and flux attack effects that occur when polymer layer 304 is in close physical proximity to the interface 306. The crack 312 can lead to delamination of the polymer layer 304 from the UBM structure 302, thereby decreasing a reliability of chip packages that include the typical UBM structure 302. On the other hand, in the examples shown in FIGS. 2A to 2C, since formation of IMC and flux attack effects are eliminated or substantially reduced in the UBM structure 128-1, 128-2 (e.g. due to the provision of the gap 136 between polymer layer 120 and the interface 138), the risk of delamination of the polymer layer 120 from UBM structure 128-1, 128-2 is reduced, thereby increasing the reliability of the chip package 100.

FIGS. 4A to 4F show various examples of the UBM structure 128-1, 128-2, in accordance with various embodiments. In the example shown in FIG. 4A, a greater number of bridges 140 are formed at regular intervals along a perimeter of the central portion 128-1 of the UBM structure 128-1, 128-2 as compared to the example shown in FIG. 2B. The formation of a greater number of bridges 140 can decrease an electrical resistance between the peripheral portion 128-2 and the central portion 128-1 of the UBM structure 128-1, 128-2. Furthermore, a current density within each bridge 140 is decreased by providing a greater number of bridges 140, thereby reducing the power dissipation per unit area. This, in turn, increases a power efficiency of the semiconductor device having such a UBM structure 128-1, 128-2. FIG. 4B shows the UBM structure 128-1, 128-2 in FIG. 4A following the formation of the polymer layer 120 over the RDL 118 and the peripheral portion 128-2 and also following the formation of the external connector 130 over the central portion 128-1 of the UBM structure 128-1, 128-2.

In the example shown in FIG. 4C, the bridges 140 are formed such that a lateral dimension of the first end 140-1 of each bridge 140 is smaller than a lateral dimension of the second end 140-2 of each bridge 140. In the example shown in FIG. 4C, the first end 140-1 of each bridge 140 is shown being shaped as a triangular structure along a perimeter of the central portion 128-1 of the UBM structure 128-1, 128-2. Similar to the effects provided by the embodiment shown in FIG. 4B, formation of a bridge 140 that has a wider lateral dimension at the second end 140-2 compared to the first end 140-1 can decrease an electrical resistance between the peripheral portion 128-2 and the central portion 128-1 of the UBM structure 128-1, 128-2. FIG. 4D shows the UBM structure 128-1, 128-2 in FIG. 4C following the formation of the polymer layer 120 over the RDL 118 and the peripheral portion 128-2 and also following the formation of the external connector 130 over the central portion 128-1 of the UBM structure 128-1, 128-2.

In the examples shown in FIGS. 4E and 4G, the central portion 128-1 of the UBM structure 128-1, 128-2 is formed as a conductive grid or a conductive mesh. FIGS. 4F and 4H shows the UBM structure 128-1, 128-2 in FIGS. 4E and 4G following the formation of the polymer layer 120 over the RDL 118 and the peripheral portion 128-2 and also following the formation of the external connector 130 over the central portion 128-1 of the UBM structure 128-1, 128-2. By forming the central portion 128-1 of the UBM structure 128-1, 128-2 as a mesh, a uniformity of the external connector 130 is improved. Furthermore, adhesion between the external connector 130 and the central portion 128-1 of the UBM structure 128-1, 128-2 is also enhanced.

In the example shown in FIG. 4I, the peripheral portion 128-2 of the UBM structure 128-1, 128-2 is shaped as a polygon. Furthermore, the bridges 140 are formed such that a lateral dimension of the first end 140-1 of each bridge 140 is smaller than a lateral dimension of the second end 140-2 of each bridge 140. By changing the shape of the peripheral portion 128-2 of the UBM structure 128-1, 128-2, the parasitic capacitance between the central portion 128-1 and the peripheral portion 128-2 may be reduced. Consequently, a shape of the peripheral portion 128-2 may be optimized based on the criteria of minimizing parasitic capacitance between the central portion 128-1 and the peripheral portion 128-2. FIG. 4J shows the UBM structure 128-1, 128-2 in FIG. 4I following the formation of the polymer layer 120 over the RDL 118 and the peripheral portion 128-2 and also following the formation of the external connector 130 over the central portion 128-1 of the UBM structure 128-1, 128-2.

In the example shown in FIG. 4K, the peripheral portion 128-2 and the central portion 128-1 are shaped so as to match a shape of a BGA bump that may be formed over the central portion 128-1 of the UBM structure 128-1, 128-2. In the embodiment shown in FIG. 4K, each of the peripheral portion 128-2 and the central portion 128-1 is shaped as an oval since the BGA bump has oval shape in a top-down view. FIG. 4L shows the UBM structure 128-1, 128-2 in FIG. 4K following the formation of the polymer layer 120 over the RDL 118 and the peripheral portion 128-2 and also following the formation of the external connector 130 over the central portion 128-1 of the UBM structure 128-1, 128-2.

Figure 5A:
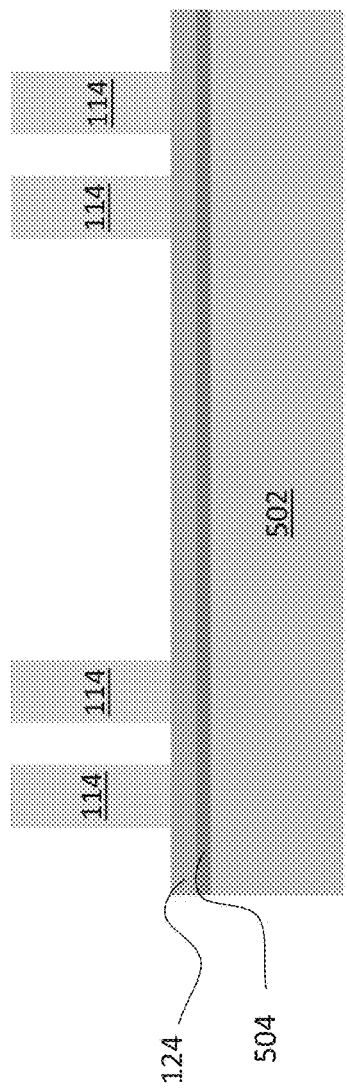
FIGS. 5A to 5F show a process flow illustrating some of the steps of a method of forming the chip package shown in FIG. 1, in accordance with an embodiment.

FIGS. 5A to 5F show a process flow illustrating some of the steps of a method of forming the chip package 100 shown in FIG. 1, in accordance with an embodiment. A carrier 502 may be provided. The carrier 502 may provide temporary mechanical and structural support to the features of the chip package 100 that are formed during subsequent processing steps. The carrier 502 may include, for example, glass, silicon, silicon oxide, aluminum oxide, and the like. The carrier 502 may, as an example, be a carrier wafer, and a plurality of chip packages 100 may be formed over the carrier 502. However, for the sake of simplicity, the formation of only one such chip package 100 is shown in the process flow depicted in FIGS. 5A to 5F. As shown in FIG. 5A, an adhesive layer 504 may be formed over the carrier 502. The adhesive layer 504 may be formed by a process that rolls and attaches the adhesive layer 504 to the carrier 502. In some embodiments, the adhesive layer 504 may be a die attach film (DAF) or a light-to-heat-conversion (LTHC) release layer. Also shown in FIG. 5A is dielectric layer 124, which may be formed over the adhesive layer 504 by a suitable process such as spinning, chemical vapor deposition (CVD), plasma-enhanced CVD (PECVD), or the like.

As shown in FIG. 5A, the one or more first conductive vias 114 may be formed over the dielectric layer 124. In some embodiments, openings corresponding to the locations of the one or more first conductive vias 114 may be formed in the dielectric layer 124 (e.g. by a drilling process). A seed layer may subsequently be formed in these openings and the one or more first conductive vias 114 may be plated over the seed layer. Other processes of formation such as sputtering, evaporation, PECVD and/or the like may alternatively be used depending upon the desired materials.

Figure 5B:
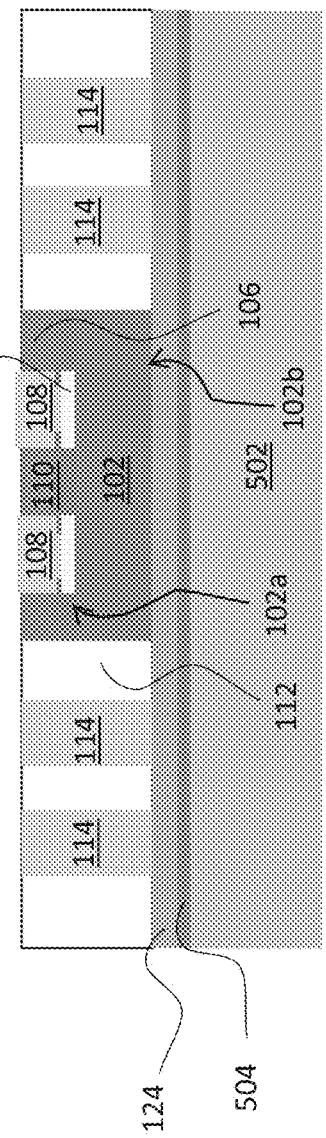

As shown in FIG. 5B, the die 102 may subsequently be picked and placed over the dielectric layer 124. The die 102 may be laterally separated from the one or more first conductive vias 114.

After the die 102 is positioned, the molding compound 112 may be formed around dies 102 as illustrated by FIG. 5B. Suitable methods for forming molding compound 112 may include compressive molding, transfer molding, liquid encapsulant molding, and the like. For example, molding compound 112 is shaped or molded using a molding tool (not illustrated) which may have a border or other feature for retaining molding compound 112 when applied. The molding tool may be used to dispense molding compound 111 around die 102 to force molding compound 111 into openings and recesses, eliminating air pockets or the like. Molding compound 111 may be dispensed around die 102 in liquid form. Subsequently, a curing process is performed to solidify molding compound 112. Molding compound 112 may be formed to initially extend over and cover top surfaces of die 102. Next, a planarization process (e.g., a mechanical grinding, chemical mechanical polish (CMP), or other etch back technique) may be employed to remove excess portions of molding compound 112 over die 102. After planarization, connectors (e.g., conductive pillars 108) of die 102 are exposed, and top surfaces of molding compound 112 and die 102 may be substantially level.

Figure 5C:
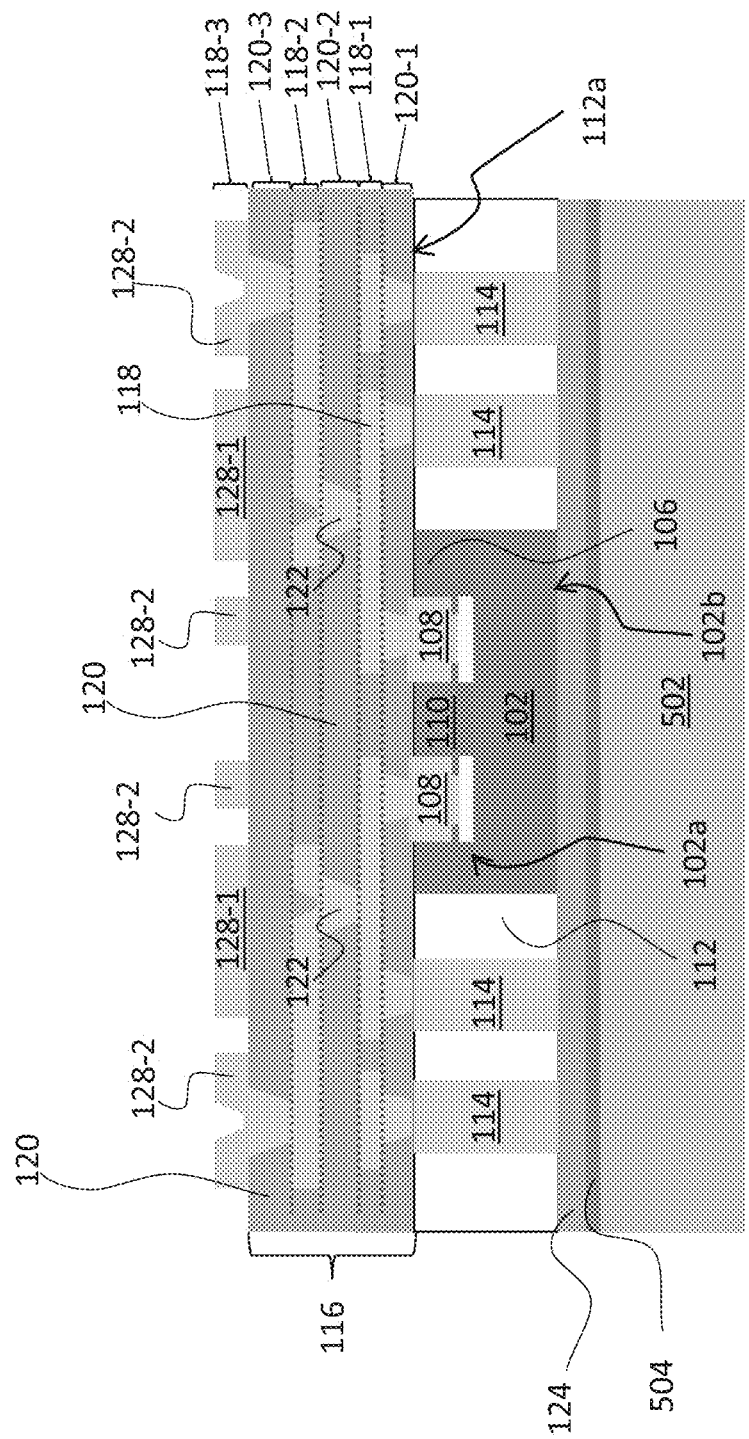

Referring to FIG. 5C, the redistribution structure 116 may be formed over the molding compound 112. As described above in respect of FIG. 1, the redistribution structure 116 extends laterally past edges of die 102 over the first surface 112a of molding compound 112. The polymer layers 120 may be formed using any suitable method, such as, a spin-on coating technique, lamination, and the like.

Conductive features such as the RDLs 118, the UBM structure 128-1, 128-2, and the second conductive vias 122 may be formed by patterning polymer layers 120 (e.g., using a combination of photolithography and etching processes) and forming conductive features over and in the patterned polymer layer. The formation of the RDLs 118, the UBM structure 128-1, 128-2, and the second conductive vias 122 may include depositing a seed layer (not shown), using a mask layer (not shown) having various openings to define the shape of the RDLs 118, the UBM structure 128-1, 128-2, and the second conductive vias 122. The openings are subsequently filled using an electro-chemical plating process, for example. The mask layer and excess portions of the seed layer may then be removed. The number of polymer layers 120, RDLs 118, UBM structures 128-1, 128-2, and second conductive vias 122 are not limited to the illustrated embodiment of FIG. 5C. For example, RDLs 116 may include any number of stacked, electrically connected conductive features in multiple polymer layers 120.

Figure 5D:
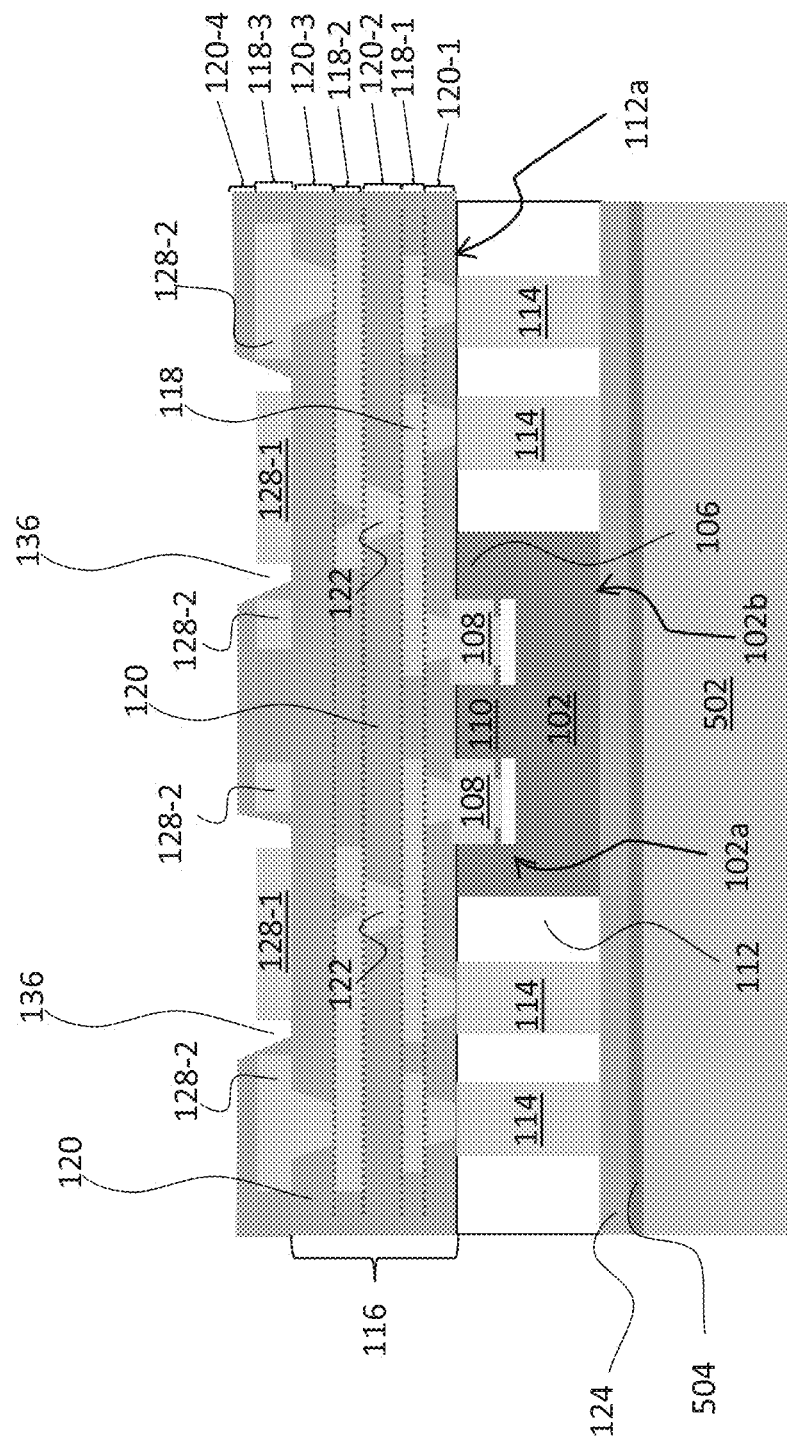

As shown in FIG. 5C, this step of the process flow leaves the UBM structure 128-1, 128-2 exposed. Consequently, in the next step, as shown in FIG. 5D, the top-most polymer level 120-4 is formed over the peripheral portion 128-2 of the UBM structure 128-1, 128-2 and the polymer level 120-3. Any suitable method, such as, a spin-on coating technique, lamination, and the like may be used. However, a lithographic process is also performed to form the gap 136 between the top-most polymer layer 120 and the central portion 128-1 of the UBM structure 128-1, 128-2.

Figure 5E:
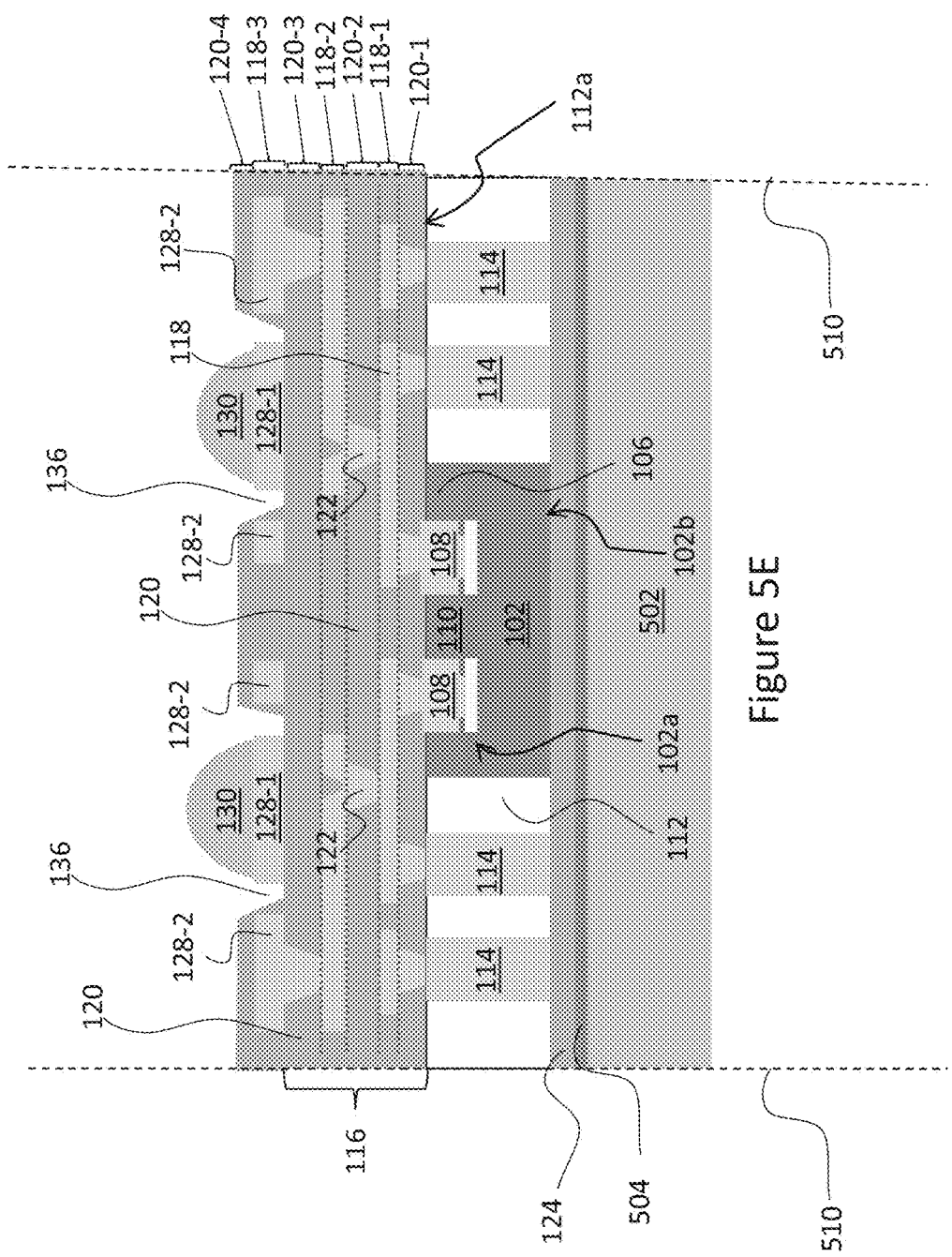
Figure 5F:
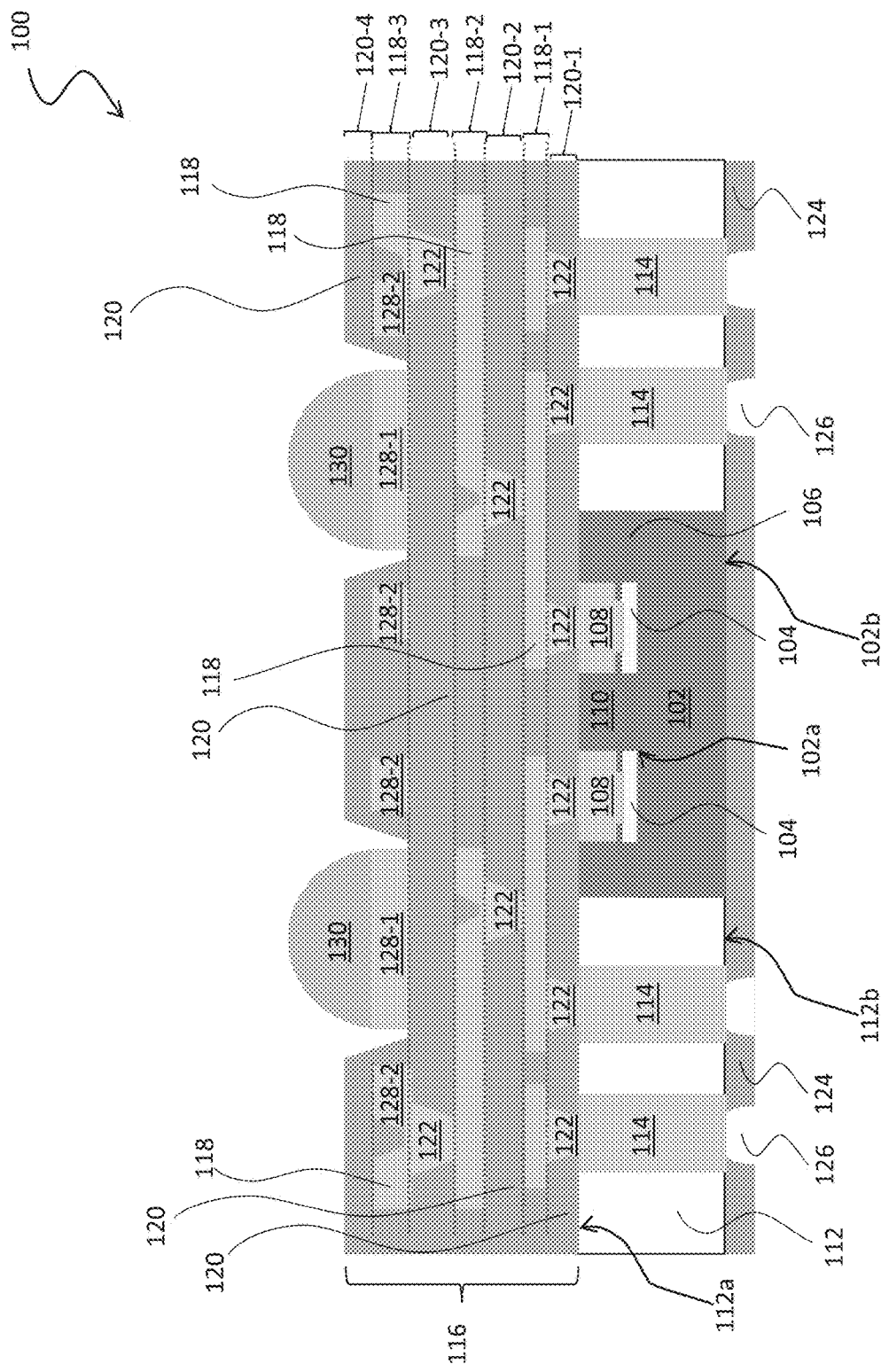

Referring to FIG. 5E, the external connector 130 may be formed over the central portion 128-1 of the UBM structure 128-1, 128-2. This may be achieved by a ball mount process, as an example, although other suitable processes may be possible as well. The external connector 130 may be used to electrically connect chip package 100 to other package components such as another device die, interposers, package substrates, printed circuit boards, a mother board, and the like. Subsequently, carrier 502 may be removed and each chip package 100 (including die 102, corresponding portions of RDLs 118, UBMs 128-1, 128-2, and external connectors 130) may be singulated along scribe lines 510 using a suitable die saw technique. FIG. 5F illustrates the completed chip package 100 after singulation.

According to various embodiments described herein, a chip package may be provided. The chip package may include a die, a redistribution structure over the die, and an under-bump metallurgy (UBM) structure over the redistribution structure. The UBM structure may include a central portion, a peripheral portion physically separated from and surrounding a perimeter of the central portion, and a bridging portion having a first end and a second end opposite the first end. The first end of the bridging portion may be coupled to the central portion of the UBM structure, while the second end of the bridging portion may be coupled to the peripheral portion of the UBM structure.

According to various embodiments described herein, a chip package may be provided. The chip package may include a die, a molding compound surrounding the die, and a multi-level redistribution layer (RDL) over the die and a first surface of the molding compound. The chip package may further include an under-bump metallurgy (UBM) structure over and electrically coupled to the multi-level RDL, wherein the UBM structure has a pad region and a peripheral portion laterally separated from and surrounding a perimeter of the pad region. The chip package may further include an external connector over pad region of the UBM structure.

According to various embodiments described herein, a method of forming a chip package may be provided. The method may include: attaching a die to a carrier; forming a molding compound around sidewalls of the die; forming a redistribution structure comprising a plurality of redistribution layers (RDLs) over the die and the molding compound; forming an under-bump metallurgy (UBM) structure over a top-most RDL of the redistribution structure, the UBM structure comprising a pad region and a peripheral portion laterally separated from and surrounding a perimeter of the pad region; forming an external connector over the pad region of the UBM structure; and removing the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a die;
   a redistribution structure over the die; and
   an under-bump metallurgy (UBM) structure over the redistribution structure, the UBM structure comprising a central portion, a peripheral portion physically separated from and surrounding a perimeter of the central portion, and a bridging portion having a first end and a second end opposite the first end, the first end of the bridging portion coupled to the central portion of the UBM structure, the second end of the bridging portion coupled to the peripheral portion of the UBM structure, the second end having a greater width than the first end.

2. The chip package of claim 1, further comprising a polymer layer encapsulating the peripheral portion of the UBM structure, wherein a sidewall of the polymer layer is separated from a sidewall of the central portion of the UBM structure.

3. The chip package of claim 2, where the sidewall of the polymer layer and the sidewall of the central portion of the UBM structure are separated by a distance in a range from about 2 micrometers to about 50 micrometers.

4. The chip package of claim 2, wherein an air gap is disposed between the sidewall of the polymer layer and the sidewall of the central portion of the UBM structure.

5. The chip package of claim 1, further comprising:
   a molding compound at least laterally encapsulating the die; and
   one or more first conductive vias extending through the molding compound.

6. The chip package of claim 5, wherein the redistribution structure extends laterally over the one or more first conductive vias and over the molding compound.

7. The chip package of claim 1, wherein the redistribution structure extends laterally past edges of the die.

8. The chip package of claim 1, further comprising:
   an external connector disposed over the central portion of the UBM structure.

9. A chip package, comprising:
   a die;
   a molding compound surrounding the die;
   a multi-level redistribution layer (RDL) over the die and a first surface of the molding compound;
   an under-bump metallurgy (UBM) structure over and electrically coupled to the multi-level RDL, wherein the UBM structure comprises a pad region and a peripheral portion laterally separated from and surrounding a perimeter of the pad region;
   an external connector over the pad region of the UBM structure; and
   a polymer material encapsulating conductive features of the multi-level RDL, the polymer material having a portion covering the peripheral portion of the UBM structure, the portion of the polymer material physically separated from the pad region of the UBM structure.

10. The chip package of claim 9, where the UBM structure further comprises a bridging portion extending from a sidewall of the pad region to the peripheral portion of the UBM structure.

11. The chip package of claim 10, wherein the bridging portion comprises a plurality of bridges formed at regular intervals along the perimeter of the pad region of the UBM structure.

12. The chip package of claim 9, further comprising one or more conductive vias extending through the molding compound from the first surface of the molding compound to a second surface of the molding compound opposite the first surface.

13. The chip package of claim 9, wherein the pad region of the UBM structure comprises a conductive grid.

14. The chip package of claim 9, wherein the pad region further comprises a plurality of openings arranged to form a conductive grid in the pad region.

15. A method for manufacturing a chip package, the method comprising:

attaching a die to a carrier;

forming a molding compound around sidewalls of the die;

forming a redistribution structure comprising a plurality of redistribution layers (RDLs) over the die and the molding compound;

forming an under-bump metallurgy (UBM) structure over a top-most RDL of the redistribution structure, the UBM structure comprising a pad region and a peripheral portion laterally separated from and surrounding a perimeter of the pad region;

forming a polymer material over the peripheral portion of the UBM structure to encapsulate the peripheral portion of the UBM structure;

forming an external connector over the pad region of the UBM structure; and removing the carrier.

16. The method of claim 15, wherein forming the UBM structure comprises at least one of a photolithography process, an etching processes, or an electro-chemical plating process.

17. The method of claim 15, wherein attaching the die to the carrier comprises attaching a bottom surface of the die to a top surface of the carrier using a die attach film.

18. The method of claim 15, wherein the polymer material is laterally separated from the pad region of the UBM structure.

19. The method of claim 15, wherein a gap is disposed between a sidewall of the polymer material and the pad region of the UBM structure.

20. The method of claim 15, further comprising forming a bridge portion in the UBM structure, the bridge portion interposed between the pad region and the peripheral portion.

* * * * *